(12) United States Patent
Jacobson (10) Patent No.: US 7,428,674 B1
(45) Date of Patent: Sep. 23, 2008

(54) MONITORING THE STATE VECTOR OF A TEST ACCESS PORT

(75) Inventor: Neil G. Jacobson, Los Altos, CA (US)

(73) Assignee: XILINX, Inc., San Jose, CA (US)

( * ) Notice: Subject to any disclaimer, the term of this patent is extended or adjusted under 35 U.S.C. 154(b) by 228 days.

(21) Appl. No.: 11/333,973

(22) Filed: Jan. 17, 2006

(51) Int. Cl.
*G01R 31/28* (2006.01)

(52) U.S. Cl. .......................... 714/724; 714/21; 714/49; 714/50; 714/51; 714/726; 714/727; 714/733; 714/734; 714/703; 716/4; 716/16

(58) Field of Classification Search ........................ None
See application file for complete search history.

(56) References Cited

U.S. PATENT DOCUMENTS

| | | | |
|---|---|---|---|
| 5,771,240 A * | 6/1998 | Tobin et al. .................. 714/724 |
| 6,539,507 B1 * | 3/2003 | Juenemann et al. .......... 714/726 |
| 6,550,031 B1 * | 4/2003 | Godfrey et al. .............. 714/726 |
| 6,594,802 B1 * | 7/2003 | Ricchetti et al. ................ 716/4 |
| 6,760,876 B1 * | 7/2004 | Grannis, III ................. 714/729 |
| 6,803,785 B1 * | 10/2004 | May et al. ....................... 326/39 |
| 7,216,275 B2 * | 5/2007 | Liang ........................... 714/727 |
| 7,234,091 B2 * | 6/2007 | Liang ........................... 714/727 |
| 2005/0204221 A1 * | 9/2005 | Swoboda ....................... 714/724 |

* cited by examiner

*Primary Examiner*—John P Trimmings
(74) *Attorney, Agent, or Firm*—LeRoy D. Maunu (57) ABSTRACT

Monitoring of the state vector of a test access port (TAP) permits isolation of the root cause of improper transitions of the state vector due to various factors, including electrical noise. The test access port includes TCK, TMS, TDI, and TDO. A circuit for monitoring the state vector includes a TAP controller, a storage circuit, and a sampling circuit. The TAP controller updates the state vector for each transition of TCK. The storage circuit stores a value of the state vector responsive to transitions of TCK while a write enable is enabled. To permit generating the write enable without additional pins and without violating a protocol for the test access port, the write enable may be generated in response to a plurality of transitions of TDI of the test access port during an interval in which TMS and TCK of the test access port have no transitions.

19 Claims, 5 Drawing Sheets

MONITORING THE STATE VECTOR OF A TEST ACCESS PORT

FIELD OF THE INVENTION

The present invention generally relates to a test access port for verification of an electronic circuit.

BACKGROUND

Many integrated circuits include a test access port that may be used to verify the proper operation of the integrated circuit and the proper operation of the system that contains the integrated circuit, including the printed circuit board on which the integrated circuit is mounted. A test access port provides a test clock (TCK) signal, a test mode select (TMS) signal, a test data input (TDI) signal, and a test data output (TDO) signal. The TDI signal may be used to serially shift a bit of data into the integrated circuit each rising edge of the TCK signal and the TDO signal may be used to serially shift a bit of data out of the integrated circuit each falling edge of the TCK signal. A test access port may be implemented according to the IEEE 1149.1 standard and derived standards, such as IEEE 1532 and IEEE 1149.6.

An operating mode for the test access port may determine the destination for data shifted into the integrated circuit at the TDI signal and the source for data shifted out of the integrated circuit at the TDO signal. The operating mode of the test access port may be specified by one of sixteen states of a state vector of a finite state machine. Each state of the finite state machine transitions to one of two possible next states on each rising edge of the TCK signal, with the next state for a current state of the finite state machine determined by the value of the TMS signal at the rising edge of the TCK signal. Thus, the TMS signal may be used to control the operating mode of the test access port.

While the test access port is very useful for determining the cause of improper operation for many aspects of an integrated circuit, the test access port may have limited usefulness for determining the cause of improper operation related to the test access port itself. For example, electrical noise may cause the finite state machine of the test access port to make improper transitions between states, such that the operating mode of the test access port cannot be properly controlled by the TMS signal. Determining the cause of improper operation may be time-consuming and expensive when the operating mode of the test access port cannot be properly controlled due to such electrical noise. The present invention may address one or more of the above issues.

SUMMARY OF THE INVENTION

Various embodiments of the invention provide a circuit for monitoring a state vector for a test access port (TAP), including a TAP controller, a storage circuit, and a sampling circuit. The test access port provides a test clock (TCK) signal, a test mode select (TMS) signal, a test data input (TDI) signal, and a test data output (TDO) signal. The TAP controller updates the state vector from a first value to a second value responsive to transitions of the TCK signal, with the second value being a function of the first value and a value of the TMS signal. The storage circuit stores a value of the state vector responsive to transitions of the TCK signal while a write enable is enabled. The sampling circuit generates the write enable responsive to at least one of the TCK signal, the TMS signal, the TDI signal, and the TDO signal.

Various other embodiments of the invention provide a method for monitoring a state vector for a test access port that provides a test clock (TCK) signal, a test mode select (TMS) signal, a test data input (TDI) signal, and a test data output (TDO) signal. The state vector is updated from a first value to a second value in response to a transition of the TCK signal, with the second value being a function of the first value and a value of the TMS signal. A write enable is generated in response to a plurality of transitions of the TDI signal of the test access port during an interval in which the TMS signal and the TCK signal of the test access port have no transitions. A value of the state vector is saved responsive to transitions of the TCK signal of the test access port while the write enable is enabled. A saved value of the state vector is accessed from the test access port.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
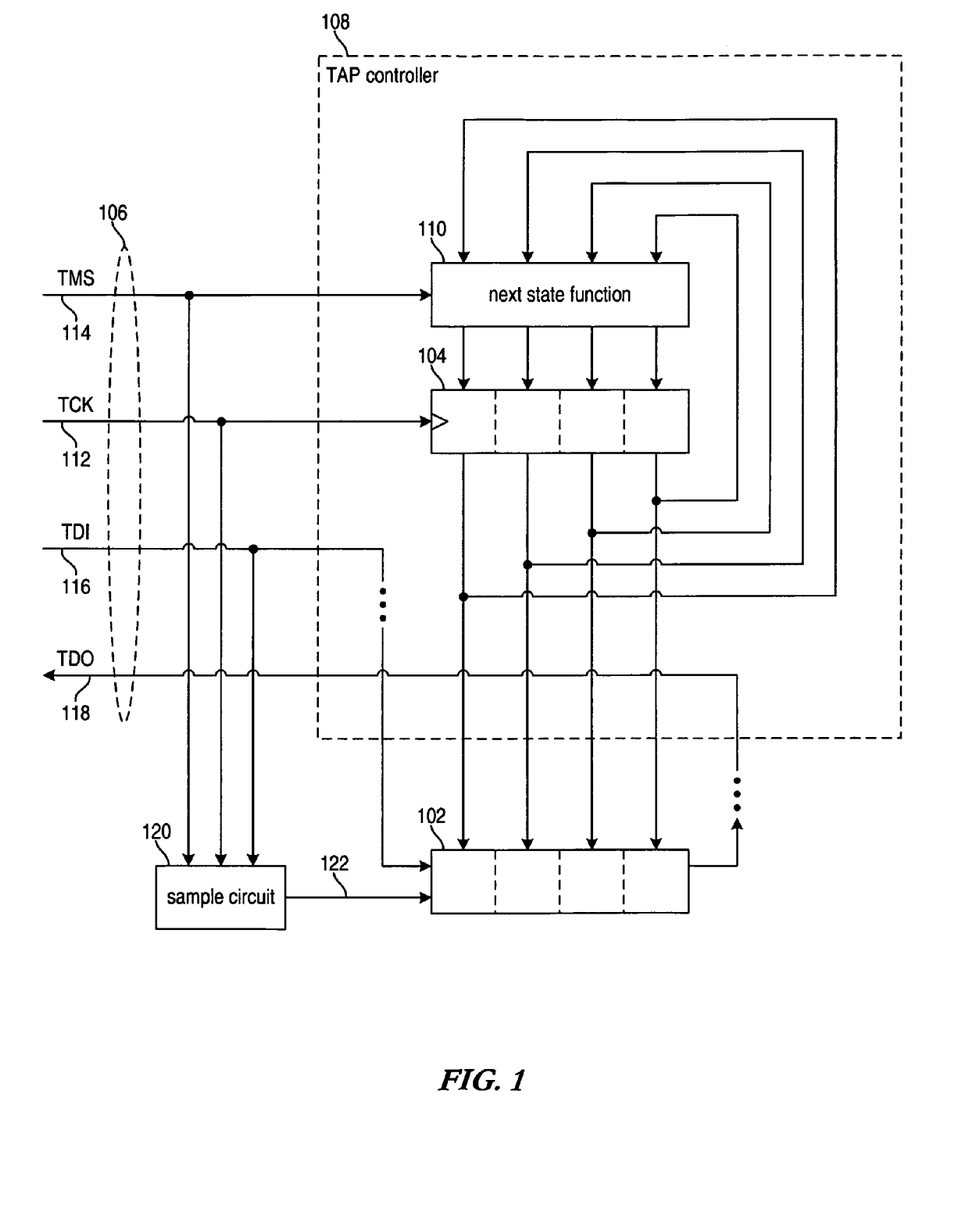
FIG. 1 is a block diagram of a circuit using a register for monitoring a state vector for a test access port in accordance with various embodiments of the invention.

FIG. 1 is a block diagram of a circuit using a register 102 for monitoring a state vector 104 for a test access port 106 in accordance with various embodiments of the invention. The test access port 106 controls the operation of a test access port (TAP) controller 108. A test access port 106 may be used to debug the operation of an integrated circuit (not shown) that has a TAP controller 108 and external pins for the test access port 106.

The TAP controller 108 may include a 4-bit state vector 104 having 16 possible state values according to various standards, such as IEEE 1149.1 and derived standards, such as IEEE 1532 and IEEE 1149.6. State vectors having different sizes may be used, for example with standards having a different number of states. The state vector 104 may be updated from next-state function 110 at each rising transition of the test clock (TCK) signal on line 112 of the test access port 106. The next-state value from the next-state function 110 may be a function of the current-state value of the state vector 104 and a current value of the test mode select (TMS) signal on line 114. Thus, the value of the state vector 104 may normally be controlled by the TMS signal on line 114, although providing a particular value for the state vector 104 may require that successive specific values are provided for the TMS signal on line 114 over a sequence of rising transitions of the TCK signal on line 112.

Certain conditions, such as electrical noise in the signals on lines 112, 114, 116, and 118 of the test access port 106, may cause the state vector 104 to make an unexpected transition. In one example, electrical noise on the TCK signal on line 112 may cause the state vector 104 to make an extra state transition to an incorrect state. In another example, the wrong value may be received for the TMS signal on line 114 due to electrical noise during a rising transition of the TCK signal on line 112, causing the state vector 104 to make a state transition to an incorrect state. For instance, a debugger (not shown) controls the test access port 106 and proper operation of the test access port 106 requires that the actual state of the state vector 104 remains synchronized with the state value expected by the debugger. Consider the situation in which the state vector 104 is in the shift-data state that is repeated to serially shift data from the debugger through the test data in (TDI) signal on line 116, through a register within the integrated circuit, through the test data out (TDO) signal on line 118, and back to the debugger. If the shift-data state is prematurely exited due to electrical noise, the debugger may continue to serially shift data, but the TAP controller 108 may stop accepting the data from the TDI signal on line 116 and may also stop providing the correct data to the TDO signal on line 118.

When the state vector 104 is in an incorrect state or in a state that is unknown to the debugger, the debugger can generally reset the state vector 104 to a known state, for example, by providing a value of one for the TMS signal on line 114 for at least five rising transitions of the TCK signal on line 112. The debugger needs to be able to detect this incorrect state condition in order to recover. In addition, if this condition occurs repeatedly then the ability to effectively debug the design is limited. Moreover, the occasional corruption of the state vector 104 due to electrical noise or other sources renders the test access port 106 unusable because each state of the TAP state machine performs a specific function. If the TAP state machine is not in the required state, the expected function cannot be executed. In addition, the debugger may inadvertently corrupt the operating state of the integrated circuit after losing synchronization with the state vector 104.

Various embodiments of the invention have a register 102 for monitoring the value of the state vector 104. The register 102 may be used to capture the value of the state vector 104 at a particular time that is selected by the sample circuit 120. The contents of the register 102 may be accessible from the test access port (TAP) 106. For example, the value in register 102 may be serially shifted out through the TDO signal on line 118 to a debugger during a shift-data or a shift-instruction state of the TAP state machine having state vector 104. In one embodiment, a scan chain including register 102 is a short scan chain to permit accessing register 102 in a small number of cycles of the test clock signal on line 112, and thereby reducing the possibility that corruption of the state vector 104 prevents successfully accessing register 102. It will be appreciated that access to register 102 may occur while corruption of state vector 104 is less likely. In one example, electrical noise may be associated with the normal operation of the integrated circuit and thus the normal operation may be suspended during access to register 102 from the test access port 106 to eliminate that source of electrical noise. In another example, reliability of the test access port 106 is improved during access to register 102 by, for example, reducing the frequency of the TCK signal on line 112. Note that other interfaces may also be used to access the contents of register 102.

When enabled by the write enable on line 122 from the sample circuit 120, the register 102 stores the current value of the state vector 104. The sample circuit 120 may generate the write enable on line 122 based on one or more signals from the test access port 106. In one embodiment, the sample circuit 120 generates the write enable on line 122 for behavior of the test access port 106 that does not usually occur during normal operation of the TAP controller 108. For example, during normal operation the TDI signal on line 116 typically makes at most one transition for each cycle of the TCK signal on line 112, and the sample circuit 120 may generate the write enable on line 122 when multiple transitions of the TDI signal on line 116 occur within a cycle of the TCK signal on line 112. Generation of the write enable on line 122 for behavior of the test access port 106 that does not usually occur during normal operation permits the test access port 106 to be used both for generating the write enable on line 122 and for the normal operation of the TAP controller 108. Thus, the sample circuit 120 may generate the write enable on line 122 without requiring any additional pins on the integrated circuit. The unusual behavior of the test access port 106 that generates the write enable on line 122 may be carefully selected not to violate the requirements of various standards, such as IEEE 1149.1, while allowing generation of the write enable on line 122 without requiring any additional pins on the integrated circuit. The TDI signal on line 116 transitions at most once during a cycle of the TCK signal on line 112 during normal operation. However, multiple transitions of the TDI signal on line 116 are not be prohibited by various standards. Thus, two or more transitions of the TDI signal on line 116 within a cycle of the TCK signal on line 112 may be used to trigger generation of the write enable on line 122. In addition, the unusual behavior of the test access port 106 that generates the write enable on line 122 may be selected to tolerate any electrical noise on the signals of the test access port 106 or any other electrical noise. Because electrical noise usually causes one or two extra transitions within a cycle of the TCK signal on line 112, three or more transitions of the TDI signal on line 116 within a cycle of the TCK signal on line 112 may be a good choice to be used to trigger generation of the write enable on line 122.

In one embodiment, a trigger, such as four transitions of the TDI signal on line 116 within a cycle of the TCK signal on line 112, may cause sample circuit 120 to generate a write enable on line 122 that stores the current value of the state vector 104 in register 102. In another embodiment, a trigger may cause sample circuit 120 to generate a write enable on line 122 after a specified delay, such that the value of the state vector 104 at the specified delay after the trigger is stored in the register 102. Example delays include a specific amount of time or a number of rising and/or falling transitions of the TCK signal on line 112. Note that in some embodiments, the write enable may be generated in response to other signals received from the test access port 106, or another interface.

An integrated circuit including the circuitry of FIG. 1 may be a programmable logic device (PLD). In such a PLD, the TAP controller 108, the register 102 and the sample circuit 120 may each be implemented, either wholly or partially, in programmable logic and routing resources of the PLD and/or dedicated circuits of the PLD.

Figure 2:
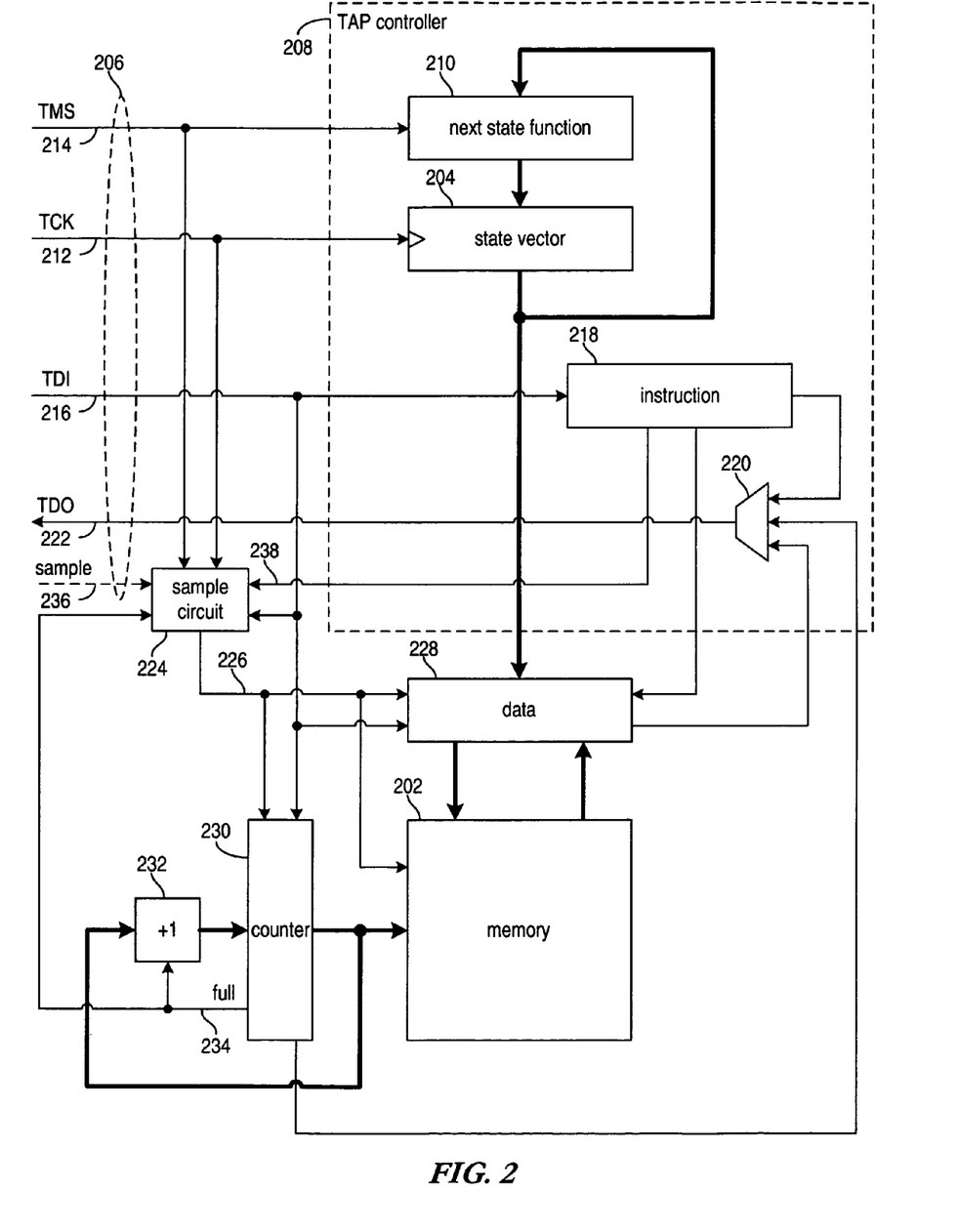
FIG. 2 is a block diagram of a circuit using a memory for monitoring a state vector for a test access port in accordance with various embodiments of the invention.

FIG. 2 is a block diagram of a circuit using a memory 202 for monitoring a state vector 204 for a test access port 206 in accordance with various embodiments of the invention. The test access port 206 controls a TAP controller 208, including updating the value of the state vector 204 from a next-state function 210 for each rising transition for the TCK signal on line 212. The next-state value from the next-state function 210 may be a function of the current-state value of the state vector 204 and a current value of the TMS signal on line 214.

The TAP state machine state vector 204 may, for example, be a shift-instruction state, which is repeated to shift an instruction from the TDI signal on line 216, through the instruction register 218, through the multiplexer 220, and to the TDO signal on line 222. The multiplexer 220 may select the input from the instruction register 218 whenever the state vector 204 is in the shift-instruction state. The value of the instruction register 218 and the state vector 204 may collectively provide a state value that determines the operation of the TAP controller 208.

Various embodiments of the invention provide a memory 202 for monitoring a state vector 204 using the test access port 206. In one embodiment, the memory 202 includes 32 locations for storing 32 values of the state vector 204. In other embodiments, the memory may have a different size. A sample circuit 224 may generate a write enable on line 226, and the write enable may be a gating of the TCK signal on line 212 in one embodiment, and a clock enable for the TCK signal on line 212 in another embodiment. When enabled by the write enable on line 226, a current value of the state vector 204 may be stored in data register 228, and subsequently stored in memory 202 at a location addressed by the counter register 230. For each write enable on line 226, incrementer 232 may increment the address in counter register 230, such that the next location in memory 202 is addressed by counter 230.

In certain embodiments, the counter 230 may generate a full condition on line 234 that causes the sample circuit 224 to cease generating the write enable on line 226, such that memory 202 is no longer written once every location in memory 202 is filled with values from state vector 204. In one embodiment, counter 230 might continue counting, using extra counting bits that are not used to address memory 202, to provide an indication of the duration of the interval between filling the memory 202 and a subsequent reading of the counter 230 from the test access port 206. Counter 230 may saturate at a maximum count to indicate overflow of counter 230.

In certain other embodiments, a full condition on line 234 from counter 230 may cause counter 230 to stop incrementing without affecting the generation of the write enable on line 226 by the sample circuit 224. After filing memory 202, a final location in the memory 202 may be repeatedly written with the value of the state vector 204 while enabled by the write enable on line 226. After the write enable on line 226 is terminated by the sample circuit 224, the final location in the memory 202 may provide the value of the state vector 204 at the termination of the write enable on line 226 even though the memory 202 is filled prior to termination of the write enable.

In certain additional embodiments, a full condition on line 234 from counter 230 may cause counter 230 to restart writing the memory 202 from the initial address location. After the write enable on line 226 is terminated by the sample circuit 224, the final location in the memory 202 may provide the value of the state vector 204 at the termination of the write enable on line 226. In addition, the contents of the counter 230 indicate the boundaries of both the most recent and earliest state information stored. In some embodiments, the sample circuit 224 may be eliminated and the write enable on line 226 may be always enabled, thus allowing for continuous sampling for every TCK transition until TCK is stopped.

In one embodiment, the sample circuit 224 generates the write enable on line 226 in response to a sample signal on line 236 that might or might not be included as a signal of the test access port 206. In another embodiment, a trigger instruction in register 218 may generate a trigger signal on line 238 that causes sample circuit 224 to start generating and/or cease generating the write enable on line 226. In yet another embodiment, the sample circuit generates the write enable on line 226 when four transitions are observed on the TDI signal on line 216 during an interval in which the TCK signal on line 212 and the TMS signal on line 214 are both zero. It will be appreciated that the sample circuit 224 may be configurable to support multiple modes of generating the write enable on line 226. For example, respective mode instructions in register 218 may determine which of several modes is used to generate the write enable on line 226 by the sample circuit 224.

After one or more values of the state vector 204 are stored in data register 228 and memory 202, these values may be read using the test access port 206. One of the states of the state vector 204 may be a shift-data state, which is repeated to shift data from the TDI signal on line 216 through a selected data chain to the TDO signal on line 222. The selected data chain may include one or more registers, such as data register 228 and counter 230. State of the TAP controller 208, such as the instruction in register 218, may determine which of several data chains is accessed during the shift-data state of state vector 204.

In one embodiment, a data-access instruction in register 218 causes the shift-data state of the state vector 204 to shift data from the TDI signal on line 216, through the data register 228, through the multiplexer 220, and to the TDO signal on line 222. The combination of the data-access instruction in register 218 and the shift-data instruction in state vector 204 may control multiplexer 220 selecting an input from the data register 228. Thus, the value of the data register 228 may be read using the data-access instruction. Similarly, a counter-access instruction may be used to read and write the value of the counter register 230. A memory-access instruction in register 218 may load into data register 228 the location in memory 202 that is currently addressed by counter 230. Thus, the contents of memory 202 may be read by a repeated sequence that updates the counter register 230 with an incremented address using the counter-access instruction, loads the addressed location in memory 202 into data register 228 using the memory-access instruction, and reads the data register 228 using the data-access instruction.

In an alternative embodiment, a memory-access instruction may combine writing a value to the counter 230 with reading a location in memory 202 addressed by the value written to counter 230. The value written to the counter 230 may be shifted from the TDI signal on line 216 through the counter 230 during repeating of a shift-data state of the state vector 204, the location in memory 202 addressed by the value written into counter 230 may be transferred to data register 228 during a capture-data state of the state vector 204, and finally the value of the data register 228 may be shifted to the TDO signal on line 222 by a return to repeating of the shift-data state. Multiplexer 220 may select inputs from either the data register 228 or the counter 230 depending upon some state that tracks the process of the memory-access instruction.

In another alternative embodiment, a read-trace-memory instruction may be serially shifted into instruction register 218 from the TDI signal on line 216 by repeating the shift-instruction state of the state vector 204 of the TAP state machine. In response during a repeated shift-data state of the state vector 204 of the TAP state machine, the TAP controller 208 may initially shift the value of the counter 230 through multiplexer 220 to the TDO signal on line 222 while also initializing counter 230 with data supplied from the TDI signal on line 216. At completion of the shifting of the value of the counter 230, the location in memory 202 addressed by the value written into counter 230 may be transferred by the TAP controller 208 to the data register 228 during the capture-data state. A return to repeating the shift-data state may subsequently shift trace data from the data register 228 to the TDO signal on line 222. At completion of the shifting of the data register 228, the counter 230 may be incremented and the location in memory 202 addressed by the updated counter 230 may be transferred by the TAP controller 208 to the data register 228 during the capture-data state. This process may be continued to read all of the trace data in memory 202.

The sample circuit 224 may provide configurable generation of the write enable on line 226. For one configuration, the sample circuit 224 may generate the write enable on line 226 following a trigger condition, such as the TDI signal on line 216 making multiple transitions while the TMS and TCK signals on lines 212 and 214 are both zero. The sample circuit 224 may generate the write enable on line 226 immediately after the trigger condition, or after a configurable delay.

For another configuration, the sample circuit 224 may continuously generate the write enable on line 226 until after the trigger condition. Thus, values for the state vector 204 may be continuously stored in memory 202 until after the trigger condition, with locations in the memory 202 being reused after the memory 202 is completely filled. The sample circuit 224 may cease generating the write enable immediately after the trigger condition or after a configurable delay. For example, a configurable delay may be set to the number of cycles of the TCK signal on line 212 that are needed to fill half of the memory 202, such that the memory 202 may include values of the state vector 204 before and after the trigger condition with the trigger condition occurring near the middle of these values of the state vector 204. Because the counter 230 may address any location in memory 202 following termination of the write enable on line 226, reading the contents of memory 202 form the test access port 206 may begin with reading the current value of the counter 230.

Figure 3:
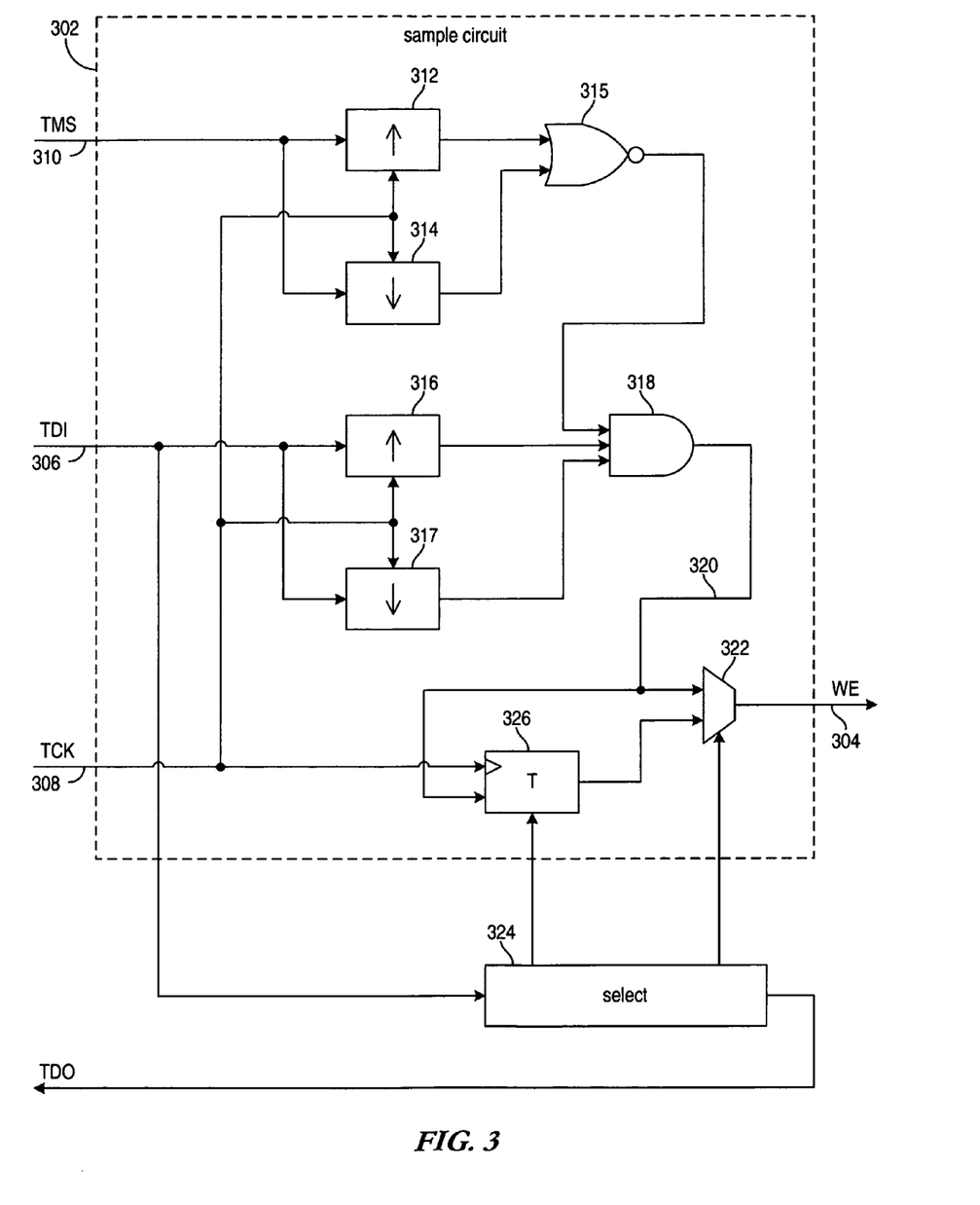
FIG. 3 is a block diagram of an example of a sample circuit in accordance with various embodiments of the invention.

FIG. 3 is a block diagram of an example of a sample circuit 302 in accordance with various embodiments of the invention. The sample circuit 302 generates a write enable on line 304 when a pulse of the TDI signal on line 306 is detected during an interval in which the TCK signal on line 308 has a value of zero and the TMS signal on line 310 has an unchanging value.

Two edge-triggered flip-flops 312 and 314 respectively detect a rising and a falling transition of the TMS signal on line 310, and these flip-flops are cleared when the TCK signal on line 308 has a value of one. During an interval in which the TCK signal on line 308 has a value of zero, one or both of flip-flops 312 and 314 are set if the TMS signal on line 310 has a change in value during the interval. Thus, NOR gate 315 outputs a value of one during the interval in which the TCK signal on line 308 has a value of zero only when the TMS signal on line 310 has an unchanging value during the interval. Similarly, edge-triggered flip-flops 316 and 317 respectively detect a rising and a falling transition of the TDI signal on line 306 during the interval in which the TCK signal on line 308 has a value of zero. Thus, both edge-triggered flip-flops 316 and 317 can become set to one only when the TDI signal on line 306 has both a rising and a falling transition during the interval in which the TCK signal on line 308 has a value of zero. When multiple transitions of the TDI signal on line 306 occur during an interval in which the TCK signal on line 308 has a value of zero and the TMS signal on line 310 has a constant value, AND gate 318 generates a trigger on line 320.

Multiplexer 322 may be configured by selection state 324, which may be an instruction in an instruction register of a TAP controller, to generate the write enable on line 304 from the trigger on line 320. Selection state 324 may be configured by shifting a selection value from the TDI signal on line 306 through the selection state 324.

Multiplexer 322 may also be configured by selection state 324 to generate the write enable on line 304 from the toggle flip-flop 326. The toggle flip-flop 326 may switch states on each rising edge of the TCK signal on line 308 at which the trigger signal on line 320 is set. Thus for an appropriate configuration of selection state 324, the write enable on line 304 may be generated during a sampling interval that begins at multiple transitions of the TDI signal on line 306 while the TCK signal on line 308 has a value of zero and the TMS signal on line 310 has a constant value, and later ends at another occurrence of multiple transitions of the TDI signal on line 306 while the TCK signal on line 308 has a value of zero and the TMS signal on line 310 has a constant value. In another embodiment, the generation of the write enable may require more than two transitions of the TDI signal while the TCK signal has a value of zero and TMS signals has a stable value of either zero or one. In yet another embodiment, the generation of the write enable may require a specific number of transitions of the TDI signal while the TCK signal has a value of zero and the TMS signal has a stable value of zero.

Figure 4:
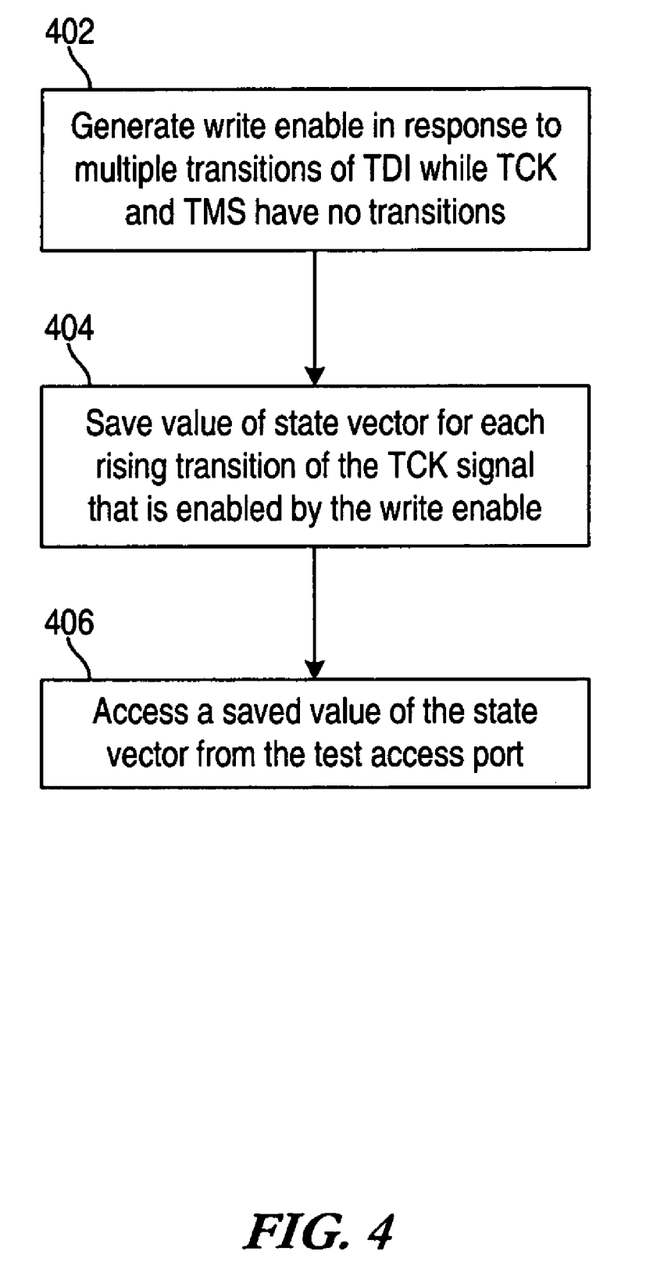
FIG. 4 is a flow diagram of a process for monitoring a state vector for a test access port in accordance with various embodiments of the invention.

FIG. 4 is a flow diagram of a process for monitoring a state vector for a test access port in accordance with various embodiments of the invention. At step 402, a write enable is generated in response to a trigger, such as multiple transitions of a TDI signal of a test access port during an interval in which the TCK and TMS signals of the test access port have no transitions. During normal usage of a test access port, the TDI signal may usually have no transitions or only one transition during each interval in which the TCK and TMS signals have no transitions, but multiple transitions are not in violation of the various standards governing usage of the test access port. Other combinations of signals at the test access port that do not occur during normal usage and are not in violation of the applicable standards may also be possible. Thus, generation of the write enable may be overlapped with normal usage of the test access port while maintaining compliance with various standards governing usage of the test access port and without impacting the normal usage of the test access port. Overlapping generation of the write enable with normal usage of the test access port may permit generation of the write enable without adding any additional pins to an integrated circuit that already has pins for the test access port. In other embodiments, one or more additional pins may be allocated for generation of the write enable.

At step 404, a value of a state vector of a TAP controller is saved for each rising transition of the TCK signal that is enabled by the write enable. Each value may be saved in a single register or in successive locations in a memory. At step 406, one or more of the saved values of the state vector is accessed from the test access port or other access interface. The saved values of the state vector may be read to help determine the cause of incorrect transitions of the state vector. For example, various sources of electrical noise or cosmic radiation may corrupt the state vector and the saved values of the state vector may help determine the actual cause of the corruption.

Figure 5:
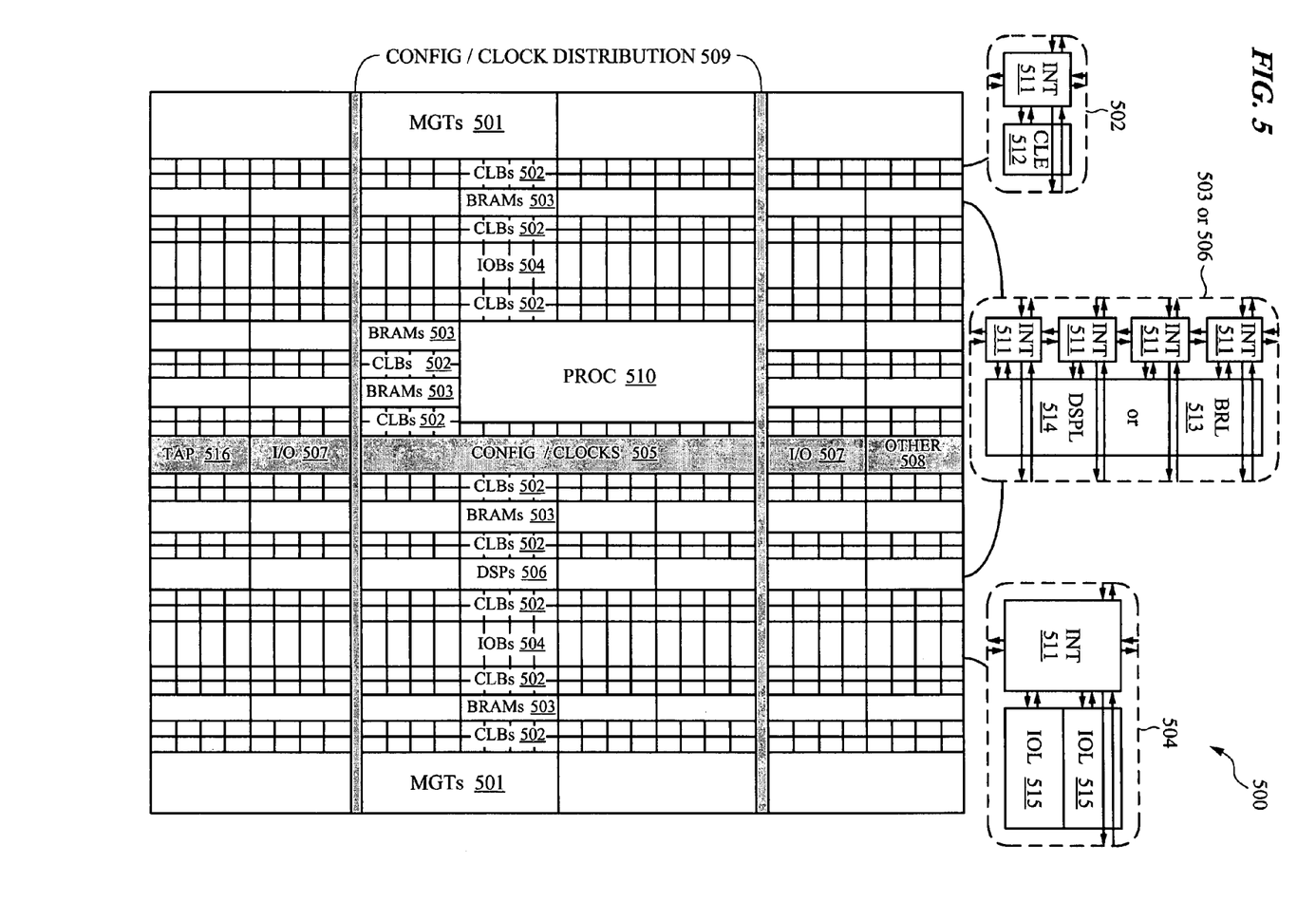
FIG. 5 is a block diagram of an example integrated circuit that may include a circuit for monitoring a state vector for a test access port in accordance with various embodiments of the invention.

FIG. 5 is a block diagram of an example integrated circuit that may include a circuit for monitoring a state vector for a test access port 516 in accordance with various embodiments of the invention. The example integrated circuit illustrated in FIG. 5 is a field programmable gate array (FPGA) 500, which is a particular type of programmable logic circuit. The FPGA 500 may include a TAP controller for a test access port and circuits for monitoring a state vector of the TAP controller.

The TAP controller and the circuits for monitoring a state vector of the TAP controller may each be implemented in programmable logic and routing resources of the FPGA 500 and/or dedicated circuits of the FPGA 500. In addition, pads of the FPGA 500 for a test access port may be dedicated pads and/or certain of the general purpose pads connected to IOBs 504. It will be appreciated that an FPGA 500 may implement multiple test access ports, with each test access port having associated circuits for monitoring a respective state vector.

Advanced FPGAs can include an array of several different types of programmable tiles providing programmable logic and interconnect resources. For example, FIG. 5 illustrates an FPGA 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), test access port 516, and other programmable logic 508 such as digital clock managers, analog-to-digital converters, system monitoring logic, and so forth. Some FPGAs also include one or more dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Various embodiments of the present invention are described in terms of monitoring a state vector for a test access port of a field programmable gate array (FPGA). Those skilled in the art will appreciate, however, that the invention could be implemented in different FPGA architectures, other types of programmable logic devices (PLDs) other than FPGAs, integrated circuits that include programmable logic circuitry and/or adapted to various application requirements, based on both volatile and non-volatile technologies.

The present invention is thought to be applicable to a variety of systems for monitoring a state vector for a test access port. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit for monitoring a state vector for a test access port (TAP), comprising:
   a TAP controller including the state vector and coupled to the test access port, the test access port providing a test clock (TCK) signal, a test mode select (TMS) signal, a test data input (TDI) signal, and a test data output (TDO) signal,
   wherein the TAP controller is adapted to update the state vector from a first value to a second value responsive to a transition of the TCK signal, the second value being a function of the first value and a value of the TMS signal;
   a storage circuit coupled to the state vector of the TAP controller, the storage circuit adapted to store a value of the state vector responsive to a transition of the TCK signal while a write enable is enabled; and
   a sampling circuit coupled to the test access port and the storage circuit, the sampling circuit adapted to generate the write enable responsive to at least one of the TCK signal, the TMS signal, the TDI signal, and the TDO signal, wherein the sampling circuit is further adapted to generate the write enable during a sample interval responsive to a trigger that is a plurality of transitions of the TDI signal of the test access port during an interval in which the TMS signal and the TCK signal of the test access port have no transitions.

2. The circuit of claim 1 wherein the sampling circuit is further adapted to generate the write enable during the sample interval responsive to the trigger that is a pulse of the TDI signal of the test access port during an interval in which the TCK signal of the test access port has a value of zero and the TMS signal of the test access port has a stable value.

3. The circuit of claim 1, wherein the sampling circuit is further adapted to generate the write enable during a sample interval that begins after a first trigger responsive to a first state value, and ends after a second trigger responsive to a second state value.

4. The circuit of claim 3, wherein the TAP controller is further adapted to generate at least one of the first trigger and the second trigger responsive to a trigger instruction for the TAP controller.

5. The circuit of claim 1, wherein at least a portion of at least one of the TAP controller, the storage circuit, and the sampling circuit is implemented in a programmable logic device.

6. The circuit of claim 1, wherein the test access port further includes a sample signal and the sampling circuit is adapted to generate the write enable responsive to the sample signal.

7. The circuit of claim 1, wherein the storage circuit is further adapted to store the first value of the state vector responsive to transitions of the TCK signal while the write enable is enabled.

8. The circuit of claim 1, wherein the storage circuit is further adapted to provide access from the test access port to the value stored in the storage circuit.

9. The circuit of claim 8, wherein the storage circuit is further adapted to serially shift the value stored in the storage circuit through the TDO signal of the test access port for transitions of the TCK signal when the state vector of the TAP controller has a predetermined value.

10. The circuit of claim 1, wherein the storage circuit includes a storage register adapted to be overwritten with the value of the state vector responsive to a transition of the TCK signal while the write enable is enabled.

11. The circuit of claim 1, wherein the storage circuit comprises:
a counter register adapted to count transitions of the TCK signal while the write enable is enabled; and
a memory adapted to store the value of the state vector at a respective location in the memory addressed by at least a portion of the counter register for each transition of the TCK signal while the write enable is enabled.

12. The circuit of claim 11, wherein the counter register is further adapted to be read and written from the test access port.

13. The circuit of claim 12, wherein the TAP controller is further adapted, responsive to a counter-register access instruction for the TAP controller, to serially shift a read value from the counter register through the TDO signal of the test access port, and to serially shift a write value through the TDI signal of the test access port to the counter register.

14. The circuit of claim 11, wherein the TAP controller is further adapted, responsive to a memory access instruction for the TAP controller, to serially shift a read value from the respective location in the memory addressed by the at least a portion of the counter register through the TDO signal of the test access port.

15. The circuit of claim 11, wherein the TAP controller is further adapted, responsive to a memory access instruction for the TAP controller, to serially shift a write value through the TDI signal of the test access port to the counter register and to serially shift a read value from the respective location in the memory addressed by the at least a portion of the counter register through the TDO signal of the test access port.

16. The circuit of claim 11, wherein the counter register is further adapted to cease counting each transition of the TCK signal responsive to all locations in the memory having stored a value of the state vector.

17. The circuit of claim 11, wherein the sampling circuit is further adapted to cease generating the write enable responsive to all locations in the memory having stored a value of the state vector.

18. A method for monitoring a state vector for a test access port that provides a test clock (TCK) signal, a test mode select (TMS) signal, a test data input (TDI) signal, and a test data output (TDO) signal, wherein the state vector is updated from a first value to a second value in response to a transition of the TCK signal, the second value being a function of the first value and a value of the TMS signal, the method comprising:
generating a write enable in response to a plurality of transitions of the TDI signal of the test access port during an interval in which the TMS signal and the TCK signal of the test access port have no transitions;
saving a value of the state vector responsive to a transition of the TCK signal of the test access port while the write enable is enabled; and
accessing a saved value of the state vector from the test access port.

19. A circuit for monitoring a state vector for a test access port that provides a test clock (TCK) signal, a test mode select (TMS) signal, a test data input (TDI) signal, and a test data output (TDO) signal, wherein the state vector is updated from a first value to a second value in response to a transition of the TCK signal, the second value being a function of the first value and a value of the TMS signal, the circuit comprising:
means for generating a write enable in response to a plurality of transitions of the TDI signal of the test access port during an interval in which the TMS signal and the TCK signal of the test access port have no transitions;
means for saving a value of the state vector responsive to a transition of the TCK signal of the test access port while the write enable is enabled; and
means for accessing a saved value of the state vector from the test access port.

* * * * *